United States Patent [19]

Jones et al.

[11] Patent Number: 4,782,422
[45] Date of Patent: Nov. 1, 1988

[54] I²T MONITORING CIRCUIT

[75] Inventors: Gregory Jones; William Owens, both of Rockford, Ill.

[73] Assignee: Sundstrand Corporation, Rockford, Ill.

[21] Appl. No.: 78,366

[22] Filed: Jul. 27, 1987

[51] Int. Cl.⁴ .............................................. H02H 3/26
[52] U.S. Cl. .................................... 361/87; 340/664; 361/93; 361/94
[58] Field of Search ....................... 361/87, 93, 94, 95, 361/96, 97; 340/664

[56] References Cited

U.S. PATENT DOCUMENTS

| | | | |
|---|---|---|---|
| 4,266,259 | 5/1981 | Howell | 361/94 |
| 4,513,342 | 4/1985 | Rocha | 361/96 |
| 4,625,283 | 11/1986 | Hurley | 361/93 |
| 4,658,323 | 4/1987 | Dougherty | 361/87 |

Primary Examiner—A. D. Pellinen
Assistant Examiner—Jeffrey A. Gaffin
Attorney, Agent, or Firm—William D. Lanyi

[57] ABSTRACT

An I²t monitoring circuit utilizes a multiplier to provide a signal that is representative of the squared value of a monitored current. The squared signal minus a DC level is provided as an input to a voltage-to-frequency converter and the output of the voltage-to-frequency converter is provided as an input to a down counter. The down counter is configured to decrement a stored value in response to the frequency of pulses received from the voltage-to-frequency converter and provide a signal in response to the magnitude of the stored value being decremented to a first predetermined magnitude. Periodically, the magnitude of the stored value in the down counter is refreshed to a second predetermined magnitude. When a signal is received from the down counter to indicate that the magnitude of the stored value has been decremented to the first predetermined magnitude, the signal is latched and a continuing signal is provided to indicate that a trip should occur. The trip signal is provided so that external circuitry can respond by either disconnecting the load from the monitored current or taking steps to reduce the magnitude of the monitored current.

17 Claims, 5 Drawing Sheets

I²T MONITORING CIRCUIT

BACKGROUND OF THE INVENTION

1. Field of the Invention

The present invention relates generally to current monitoring circuits and, more particularly, to an I$^2$t monitoring circuit which decrements a counter in response to pulses received from a voltage-to-frequency converter that is responsive to the magnitude of the current squared.

2. Description of the Related Art

Various types of circuits and monitoring systems which measure and react to electrical current characteristics are known to those skilled in the art. One particular type of monitoring circuit is responsive to the I$^2$t characteristic of a measured current. For example, U.S. Pat. No. 4,442,472, which issued to Pang et al on Apr. 10, 1984, discloses a solid state trip circuit with a digital timer. It describes an electrical circuit which actuates a trip mechanism of a circuit interrupter and includes a current sensor having a pair of output terminals and which is designed to cooperate with at least one electrical power conductor for the purpose of sensing the amount of current flowing through the conductor. Circuitry is provided for developing a voltage signal that is proportional to a sensed current signal. The magnitude of the voltage signal is used by additional circuitry to actuate a trip mechanism of a circuit interrupter when the current flowing in the electrical power conductor exceeds a predetermined threshold level. The control circuit includes a digital timing circuit which produces a signal that is responsive to the magnitude of the voltage at an input terminal of the timing circuit for producing pulses having a first frequency and also includes an additional circuit to produce pulses having a second frequency in response to the signal received at an input terminal.

U.S. Pat. No. 4,404,612, which issued to Hughes et al on Sept. 13, 1983, discloses a DC solid state overload relay for use with a DC motor controller. This patent discloses a device that monitors current signals, from an ammeter shunt, which are received by an electronic sensing unit that performs electro-mechanical overload relay functions. These functions are performed independently of each other and are provided with independently adjustable reference setting devices.

U.S. Pat. No. 4,347,541, which issued to Chen et al on Aug. 31, 1982, discloses a circuit breaker which incorporates a full wave rectifier that converts a current into a proportional voltage. A peak detector provides an approximately true peak value voltage of the standardized voltage. This device also utilizes an instantaneous trip circuit, a ground fault detector and both short term and long term delay circuits which provide trip signals upon the occurrence of certain monitored conditions.

U.S. Pat. No. 4,217,616, which issued to Jessup on Aug. 12, 1980, discloses a motor overload protection circuit which senses a motor overload current and couples this current to the input of an operational amplifier, causing the amplifier output to invert and charge a plurality of parallel connected capacitors. Although this device is not directly related to an I$^2$t circuit, it monitors an electrical current and provides a luminous source which is coupled to an output of an amplifier and becomes non-luminous when the amplifier is in its inverted state.

U.S. Pat. No. 3,604,983, which issued to Levin on Sept. 14, 1971, discloses an instantaneous and inverse-time-overcurrent sensor which comprises two rectifiers. This device is completely analog in operation and uses passive components. It provides circuitry for producing an instantaneous trip signal upon the occurrence of an excessively high value of overcurrent. It also includes a solid state reactor stage that is coupled to an inverse-time unit so as to produce a trip signal when a time-overcurrent condition in the monitored circuit exceeds a preselected value.

U.S. Pat. No. 4,589,052, which issued to Dougherty on May 13, 1986, discloses a digital I$^2$t pickup device for a static trip circuit breaker. It provides circuitry which is able to be manufactured in a single chip configuration. After an analog-to-digital conversion, a signal is compared with a continuous binary count. A time delay is obtained by means of a circuit which uses a fixed frequency to gate a pulse stream that is proportional to the squared magnitude of the overcurrent level.

U.S. Pat. No. 4,476,511, which issued to Saletta et al on Oct. 9, 1984, discloses a circuit interrupter with a numeric display. It is microprocessor based and squares a digital signal. It utilizes a rectified peak detection circuit for calculating I$^2$t.

U.S. Pat. No. 4,423,459, which issued to Stich et al on Dec. 27, 1983, discloses solid state circuit protection system which utilizes a rectified signal for the purpose of monitoring either a single phase or polyphase current flowing through a conductor. Sample values are periodically converted to digital form and tested to determine whether or not they deviate from previous samples by a predetermined amount. Samples which do not deviate by the predetermined amount cause a first counter to be incremented while deviating samples cause a second counter to be incremented. The ratio of the magnitudes of the first and second counters is used to recognize current imbalances.

U.S. Pat. No. 4,266,259, which issued Howell on May 5, 1981, discloses an overcurrent signal process or which comprises both long time and short time trip mode networks. One of the networks compares a signal to a sloping I$^2$t portion of an established trip time curve while the other network optionally measures the overcurrent signal against a second I$^2$t curve. The circuitry is completely analog and utilizes a composite peak rectified signal along with the two I$^2$t curves.

U.S. Pat. No. 4,513,342, which issued to Rocha on Apr. 23, 1985, discloses an I$^2$t protection system which utilizes a sensor that provides an output signal which is proportional to the square of the load component current. The squared current signal is integrated and compared to a current squared-time value and an output signal is enabled when the load component instantaneous I$^2$t value is greater than a current squared-time value set at the comparator. In response, this circuit removes the current flow from the protected component.

SUMMARY OF THE INVENTION

The present invention provides a circuit which combines both analog and digital techniques to measure and respond to the I$^2$t characteristic of a monitored current. In a preferred embodiment of the present invention, the detection circuit comprises a first means for providing a first signal that is representative of an electrical current. This first providing means converts the monitored electrical current signal to a voltage signal minus a DC level that represents a horizontal asymptote for the relationship between the percentage of rated current and time as will be described in greater detail below. This voltage signal is connected as an input to a second means for providing a second signal that is representative to the squared value of the voltage input signal. In a preferred embodiment of the present invention, this second providing means can be a multiplier in which two inputs of the multiplier are connected to the first providing means for the purpose of receiving the first voltage signal. The second signal, which is proportional to the squared value of the first signal minus a DC level which will be described in greater detail below, is connected as an input to a third means for providing a third signal which comprises a series of pulses. The frequency of these pulses is representative of the magnitude of the second signal. In other words, the output of the third providing means comprises a series of pulses which occur at a frequency that is representative of the magnitude of the squared voltage signal, minus the DC level, which is the second signal provided by the second providing means. In a preferred embodiment of the present invention, the third providing means comprises a voltage-to-frequency converter.

The output of the third providing means is connected as an input to a means for decrementing a stored value. This decrementing means, which in a preferred embodiment of the present invention comprises a down counter, decrements a stored value upon the occurrence of each pulse received from the voltage-to-frequency converter. Therefore, as the magnitude of the squared voltage signal increases, the value stored by the decrementing means is decreased more rapidly. The rate of decrease of the value stored by the decrementing means is directly responsive to the magnitude of the second signal which, in turn, is representative of the squared value of the first voltage signal and, therefore, responsive to the absolute magnitude of the first signal. It should be understood that, in alternative embodiments of the present invention, it is possible to configure the decrementing means in such a way that it decrements its stored value upon the occurrence of a predetermined number of pulses rather than upon the occurrence of each pulse as described above. Although the preferred embodiment is particularly configured to cause the decrementing means to decrement its stored value upon the occurrence of each pulse received from the third providing means, design considerations could possibly indicate that, in an alternative embodiment of the present invention, it is desirable to decrement the stored value after a predetermined number of pulses are received from the third providing means.

The present invention also comprises a fourth means for providing a fourth signal when the stored value is equal to a first predetermined magnitude. In a preferred embodiment of the present invention, this first predetermined magnitude is zero and the fourth signal is provided when the stored value is decremented by the decrementing means to a value equal to zero. The present invention also comprises a means for periodically setting the stored value of the decrementing means to a second predetermined magnitude. In other words, the stored value is periodically reset to a magnitude which will, in turn, be decremented by the decrementing means in response to the output of the voltage-to-frequency converter. Although the first predetermined magnitude is zero in a preferred embodiment of the present invention, it is recognized that alternative design considerations could possibly utilize a first predetermined magnitude that is equal to a positive digital value greater than zero.

In the preferred embodiment of the present invention, a monitored current is passed through a sensor, such as a resistor or a current transformer, for the purpose of developing a voltage signal that is representative of the monitored current. This sensor, which is used as the first means for providing a first signal representative of the electrical current, is a sensing resistor which has a very low inductance in the preferred embodiment. Regardless of the particular sensor used for these purposes, it is desirable that the sensor be chosen to minimize its effect on the monitored current. The monitored current can be either AC or DC. The developed voltage signal is provided to both inputs of a two-input multiplier. The output of the multiplier is representative of the voltage signal squared minus the DC level described above and this squared signal is connected to the input of a voltage-to-frequency converter. The voltage-to-frequency converter responds by providing a series of pulses at a frequency which is responsive to and representative of the magnitude of the squared input to the voltage-to-frequency converter. The use of the voltage-to-frequency converter introduces the time variable to the monitoring circuit because of the fact that the voltage-to-frequency converter provides a series of pulses at a frequency that is responsive to the magnitude of its input which is a signal that is representative of the square of the input to the multiplier minus the DC level. This series of pulses which is output by the voltage-to-frequency converter is connected, as an input, to a down counter which contains a value that is periodically reset to an initial magnitude. The present invention also provides a means for periodically resetting the value of the down counter to an initial magnitude. If the series of pulses has a frequency sufficient to decrement the stored value to the first predetermined magnitude, such as zero, prior to its being reset to its second predetermined, or initial, magnitude, a signal is provided to indicate that the magnitude of the squared signal, minus the DC level, was sufficiently high to decrement the stored value to this first predetermined magnitude. This signal indicates an overcurrent condition. The output signal from the down counter is latched, in a preferred embodiment of the present invention, for the purpose of permitting external circuitry to react to the overcurrent condition and, when desirable, to either disconnect a load from the excessive current or, alternatively, to cause steps to be taken to reduce the current in the monitored circuit.

BRIEF DESCRIPTION OF THE DRAWING

The present invention will be more fully and completely understood from a reading of the description of the preferred embodiment in conjunction with the drawing, in which.

DESCRIPTION OF THE PREFERRED EMBODIMENT

Figure 1:
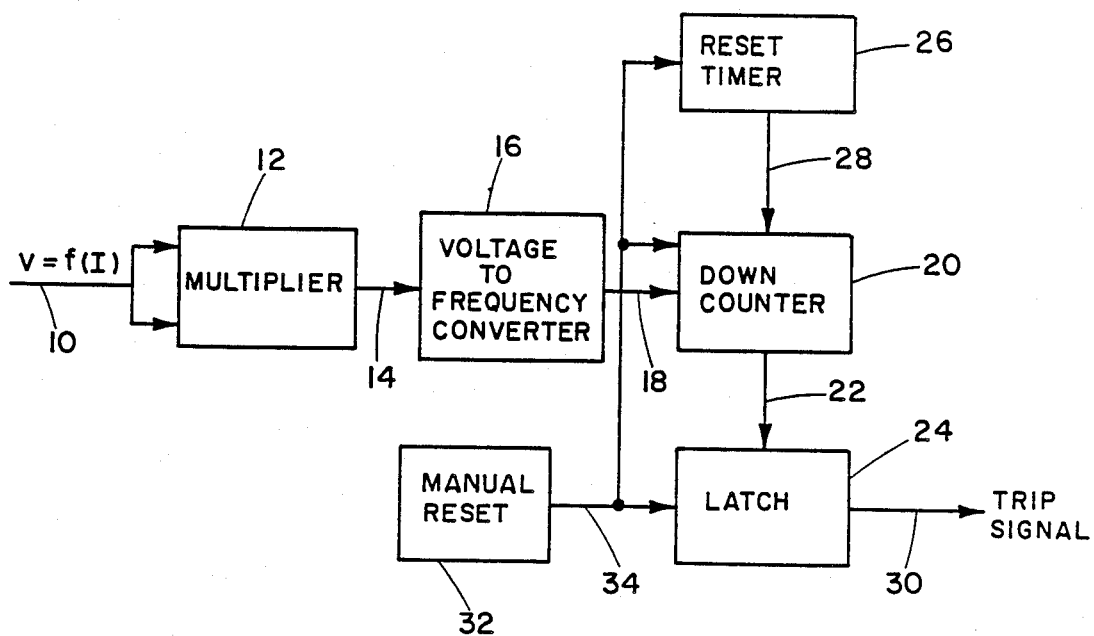
FIG. 1 is a simplified schematic of the preferred embodiment of the present invention.

FIG. 1 illustrates a simplified schematic diagram of the present invention. A first signal is provided at line 10. This first signal is a voltage signal that is representative of a monitored current signal. Although not specifically illustrated in FIG. 1, this first voltage signal can be provided by connecting a sensor, such as a resistor, in series with the monitored current signal and developing a voltage drop across the resistor to provide the first voltage signal on line 10. As discussed above, the current sensor is a resistor in a preferred embodiment of the present invention. However, it should be understood that other current sensing devices can be used in alternative embodiments. The sensing resistor used in the preferred embodiment of the present invention has a low inductance so that its effect on the monitored current is minimized. The specific means used by the present invention to provide the first signal will be more specifically described below in conjunction with FIG. 2. This first signal is connected to two inputs of a multiplier 12 which serves as a means for providing a second signal that is representative of the squared value of the first signal minus a DC level. Since the first signal is connected to two inputs of the multiplier, the output of the multiplier 12 is a second signal, on line 14, that is representative of the squared value of the input minus a DC level, on line 10, to the multiplier 12. It should be understood that, in a preferred embodiment of the present invention, two inputs of a four input multiplier are used. However, it should also be understood that, in alternative embodiments of the present invention, other configurations are possible. Many types of multipliers which permit an input signal to be squared and offset by a DC level are known to those skilled in the art. This second signal, on line 14, is connected as an input to a voltage-to-frequency converter 16. The output of the voltage-to-frequency converter 16 is a series of pulses, on line 18. This third signal, comprising the series of pulses, has a frequency that is representative of the magnitude of the second signal which is the input to the voltage-to-frequency converter 16. This series of pulses is provided as an input to a down counter 20.

The down counter 20 is configured to decrement a stored value in response to each of the pulses received from the voltage-to-frequency converter 16 on line 18. Beginning at some predetermined magnitude, the value stored by the down counter 20 is decremented upon the receipt of each pulse on line 18 and, if the stored value is decremented to a first predetermined magnitude, a signal is provided on line 22 to a latch circuit 24. Periodically, a reset timer 26 provides a signal on line 28 to the down counter 20 which causes the stored value in the down counter 20 to be refreshed, or reset, to a second predetermined magnitude. If the stored value in the down counter 20 is continually refreshed prior to its being decremented to the first predetermined magnitude, no signal will be sent on line 22 to the latch circuit 24. In a preferred embodiment of the present invention, the first predetermined magnitude is zero and the signal provided by the down counter 20, on line 22, to the latch circuit 24 therefore occurs when the value of the down counter 20 is decremented to zero.

When the latch circuit 24 receives a signal on line 22 from the down counter 20, it latches the signal and provides an output signal on line 30 which can serve as a trip signal for external circuitry. The external circuitry can respond to the trip signal on line 30 in various ways. For example, a load can be disconnected from the monitored current in response to the trip signal or, alternatively, automatic steps can be taken to reduce the magnitude of the monitored current. The specific reaction by the external circuitry in response to the trip signal on line 30 is not directly related to the present invention. Furthermore, the precise configuration of this external circuitry is not directly related to the present invention and it should be apparent that many different types of responsive circuitry can be used in conjunction with the present invention.

As can be seen in FIG. 1, a reset can be provided in conjunction with the latch circuitry 24, the reset timer 26 and the down counter 20. In one embodiment of the present invention, a manual reset 32 can be used to provide a signal on line 34 to the latch circuit 24, the reset timer 26 and the down counter 20. In response to the reset, the latch circuit 24 would typically stop outputting a signal on line 30, the reset timer 26 would be initialized and the down counter 20 would be refreshed to begin again at the second predetermined magnitude. The reset can be a manual switch or, alternatively, an automatic signal from other external circuitry which resets the latch circuit 24 after appropriate steps have been taken to either disconnect the load from the current source, reduce the magnitude of the monitored current or respond in some other appropriate way to the original existence of the trip signal on line 30. It should be understood that the reset 32 can be configured to provide signals directly to the reset timer 26, the down counter 20 and the latch circuit 24 or, alternatively, the signal from the reset 32 can be sent directly to the latch circuit 24 and indirect signals can be provided by the latch circuit 24 to the other components that require a reset operation. Either of these alternative configurations should be considered to be within the scope of the present invention.

In operation, the multiplier 12 receives, at two of its inputs, a first signal on line 10 that is representative of the monitored current. This first signal can be provided, as discussed above, by a resistor connected in series with the monitored current to develop a voltage drop that is representative of the magnitude of the monitored current. It should be understood that the monitored current can be either AC or DC and that the first signal on line 10 can therefore be either an AC or a DC voltage signal that is representative of the monitored current signal. The multiplier 12 provides a second signal on line 14 which is equivalent to the squared magnitude of the first input voltage signal minus the DC level. It should be understood that this output signal from the multiplier 12, on line 14, can either be an AC or DC signal, depending on the characteristic of the first signal on line 10.

When the voltage-to-frequency converter 16 receives the squared signal on line 14, it provides an output signal on line 18 that comprises a series of pulses at a frequency that is determined by the magnitude of the input to the voltage-to-frequency converter 16. In other words, as the first signal on line 10 increases in magnitude, the squared output signal on line 14 will also increase and the frequency of pulses on line 18 will increase in response to it. Conversely, as the first signal on line 10 decreases, its squared value on line 14 also decreases and the frequency of the pulses on line 18 will decrease accordingly. In other words, the frequency of the pulses on line 18 is representative of the magnitude of the squared signal on line 14.

The pulses that are output by the voltage-to-frequency converter 16 are connected by line 18 to a down counter 20 which decrements a stored value in response to each of the pulses received on line 18, in the preferred embodiment of the present invention. Beginning at some initial magnitude, the stored value is sequentially decremented in response to the pulses on line 18 until the stored value either reaches a first predetermined magnitude, such as zero, or is refreshed to a second predetermined magnitude by a reset timer 26. As this series of pulses is sent by the voltage-to-frequency converter 16 to the down counter 20, one of two things will eventually occur. Either the stored value will eventually be decremented to the predetermined first magnitude, such as zero, or the stored value will be refreshed to a second predetermined magnitude by the reset timer 26. If the magnitude of the monitored current is within acceptable limits, the stored value of the down counter 20 will be continually decremented to some acceptable magnitude greater than the first predetermined magnitude until the reset timer 26 refreshes the value to a magnitude equal to the second predetermined magnitude. The refresh frequency, determined by the reset timer 26, and the magnitude to which the stored value is refreshed will be such that the frequency of pulses on line 18 is not sufficient to decrement the stored value rapidly enough to reach the first predetermined magnitude. For example, in one specific embodiment of the present invention, the second predetermined magnitude is set to the value of 3000 and the period between pulses determined by the refresh rate of the reset timer 26 is approximately six seconds. With these parameters, an acceptable current magnitude would decrement the stored value from 3000 to some lower, but acceptable, value such as 600 at the time when the reset timer 26 again refreshes the value of the down connter 20 to 3000. If the first predetermined value at which a signal is sent on line 22 to the latch circuit 24 is zero, an acceptable monitored current would therefore never cause a signal to be sent on line 22. However, with these same hypothetical parameters, an excessively high monitored current will result in the frequency, on line 18, being sufficient to decrement the value of the down counter 20 to the first predetermined magnitude, such as zero, before the reset timer 26 can refresh the stored value to the second predetermined magnitude, such as 3000. This situation will cause an output signal to be sent on line 22 from the down counter 20 to the latch circuit 24. Even though the signal on line 22 may only be momentary in duration, the latch circuit 24 will latch this signal and provide a continuous signal on line 30 which serves as a trip signal for use by external circuitry. It should be understood that, following the output signal on line 22, the reset timer 26 will likely refresh the stored value of the down counter 20 in rapid succession following the occurrence of the signal on line 22. However, the presence of the latch circuit 24 will maintain a signal on line 30 in response to the output signal on line 22 from the down counter 20, even though that signal is transient, due to the operation of the reset timer 26.

Figure 2:
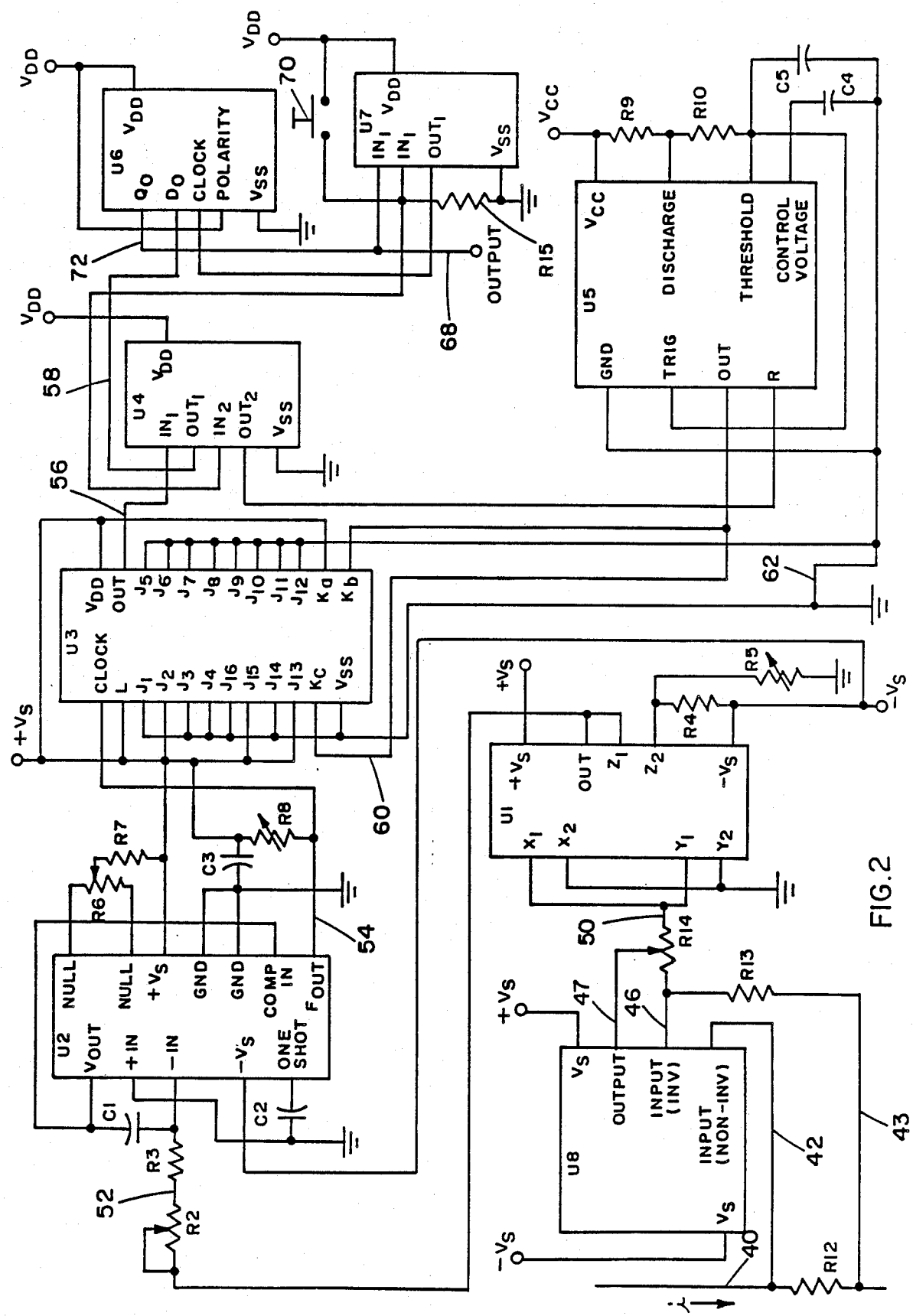
FIG. 2 is a detailed illustration of the preferred embodiment of the present invention which includes specific circuit components.

FIG. 2 illustrates a detailed schematic of the present invention with specific components which are used in one preferred embodiment of the present invention. A multiplier U1, which is functionally similar to the multiplier 12 in FIG. 1, is provided with input signals at its $X_1$ and $Y_1$ inputs. Both of these input signals are provided by a first voltage signal that is representative of a current signal being monitored. The effect of this connection to both the $X_1$ and $Y_1$ inputs of the multiplier U1 is to square the magnitude of the first voltage signal. The output of the multiplier U1 is determined, as a function of its inputs, by the relationship:

$$V_{out} = (X_1 - X_2)(Y_1 - Y_2)/10 - (Z_1 - Z_2) \quad (1)$$

In equation 1, the $X_1$ and $Y_1$ inputs are equal to each other and $Z_1$, $X_2$ and $Y_2$ are all equal to zero. This results in the relationship:

$$V_{out} = X^2/10 + Z_2 \quad (2)$$

Figure 4:
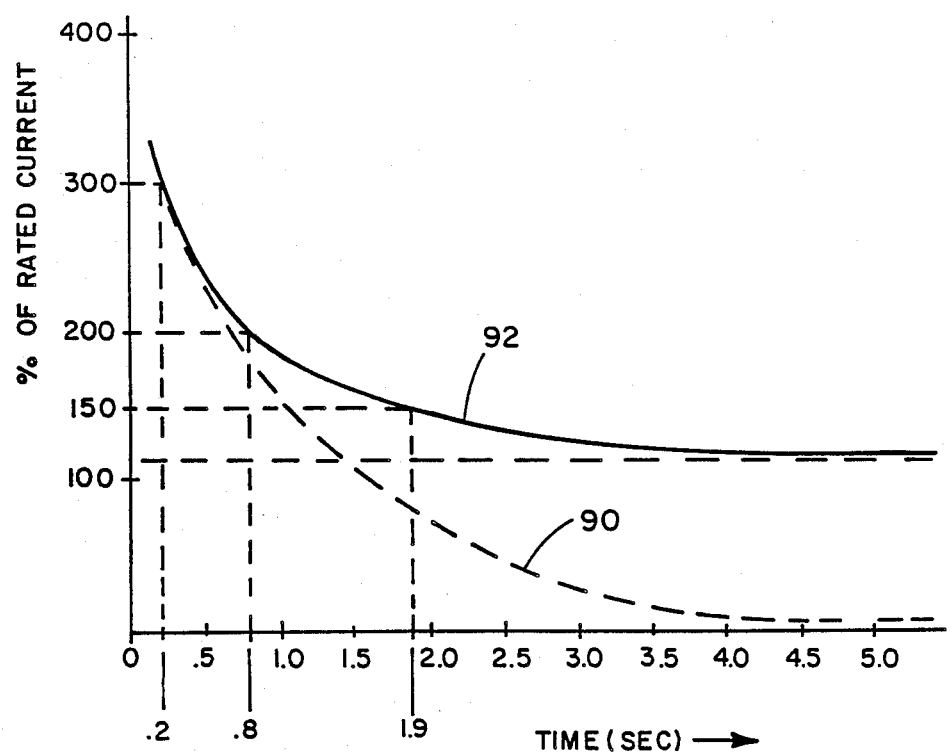
FIG. 4 is a graphical representation of the current-time relationship of a reference $I^2t$ curve provided by the present invention.

Since the first voltage signal, which is connected to the inputs of the multiplier U1, is representative of the current being monitored and, furthermore, since the magnitude of $Z_2$ is determined by resistors R4 and R5 in FIG. 2, the relationship of equation 2 shown above can be expressed as:

$$V_{out} = f^2 (I)/10 - V_S(R5/(R5+R4)) \quad (3)$$

where $V_S$ is the supply voltage which, in this specific example relating to the preferred embodiment of the present invention, is a negative 12 volts and resistor R4 is 15K ohms. The multiplier U1 squares the analog input signal and adds a DC level, equal to $Z_2$, which is determined by the magnitudes of resistors R4 and R5. It should be understood that, although $Z_2$ is added to the square of the analog input signal to the multiplier, the magnitude of $Z_2$ in the preferred embodiment of the present invention is negative. Therefore, the output of the multiplier U1, referred to herein as $Z_{out}$, is effectively reduced by this amount. As will be described below, it is possible to change the asymptote of the time-based current characteristic curve of the present invention which is shown in FIG. 4 and described below. In the preferred embodiment of the present invention, the multiplier U1 is type MPY 634 which is available in commercial quantities from the Burr-Brown Corporation. This type of multiplier is a wide band width, high accuracy, four-quadrant analog multiplier with differential X,Y and Z inputs which allow it to be configured as a multiplier, squarer, divider, square-rooter or other functions. An internal voltage reference provides precise setting of a scale factor. The differential Z input allows user-selected scale factors from 0.1 to 10 using external feedback resistors.

As described above, the input signal to the multiplier U1 is a voltage signal that is representative of the monitored current. In a preferred embodiment of the present invention, this first signal, on line 50, is provided by a resistor R12 that is connected in series with the monitored current on line 40. As can be seen in FIG. 2, a first voltage level from one terminal of the resistor R12 is connected to the non-inverting input of an operational amplifier U8 by line 42. A second voltage level is provided by connecting the other terminal of resistor R12 to the inverting input of the operational amplifier U8 by line 43 through resistor R13. As can also be seen in FIG.

2, the output of the operational amplifier U8 is connected to line 50 by line 46 with resistor R14 connected between the inverting input of the operational amplifier U8 and the connection point of lines 46 and 50. In a preferred embodiment of the present invention, the operational amplifier U8 is type LM1558/LM1458 which is a dual operational amplifier that is available in commercial quantities from the National Semiconductor Corporation. This component comprises general purpose dual operational amplifiers with the two amplifiers sharing a oommon bias network and power supply leads. Otherwise, the operation of each of the amplifiers is independent. In FIG. 2, the combination of the resistor R12, in series with the monitored current on line 40, and the operational amplifier U8 provides a first signal, on line 50, which is representative of the monitored current and which is used as an input to the multiplier U1. The input voltage $V_{in}$ to the operational amplifier U8 is amplified by the relationship shown in equation 4 below to provide the output voltage $V_{out}$ according to the relationship shown in equation 4.

$$V_{out} = V_{in}(1 + R_{14}/R_{13}) \quad (4)$$

In equation 4, resistor $R_{14}$ is the resistance between lines 46 and 47 in FIG. 2. To those skilled in the art, this configuration is referred to as a non-inverting amplifier. It should be understood that, throughout the circuit illustrated in FIG. 2, the common point is line 43 if the positive direction of current flow is in a downward direction in line 40 as shown in FIG. 2.

The output from the multiplier U1 is connected to an input of a voltage-to-frequency converter U2. The output of the voltage-to-frequency converter U2 is a second signal which varies in response to the magnitude of its input voltage. Therefore, as the magnitude of the square of the first voltage increases, the frequency output from the voltage-to-frequency converter U2 will increase. Resistors R2 and R3 comprise the input resistance $R_{in}$ of the voltage-to-frequency converter U2 and capacitor C1 is the integrater capacitance. Along with the internal operational amplifier, these components comprise an integrater circuit, but capacitor C1 does not effect the transfer characteristics. Capacitor C1 is used to determine the amplitude of the saw tooth signal that is output by the integrator. The specific components which actually determine the transfer characteristic are $R_{in}$ and capacitor C2. The relationship for the voltage-to-frequency converter is:

$$f_{out} = 0.15(V_{in}/R_{in}(C2 = 4.4 \times 10^{-11})) \quad (5)$$

It should be noted that, in equation 5, the constant 0.15 has the units of farad hertz per amp ($FHzA^{-1}$). The pullup resistor R8 should be chosen to limit the current through the output transistor to approximately eight milliamps for the voltage-to-frequency converter U2. A bypass capacitor C3 is connected across the supply side of the pull up resistor and digital ground. As is understood by those skilled in the art of electronic circuit design, it is beneficial to provide an offset null input to the internal operational amplifier. As shown in FIG. 2, this offset null input is provided by resistors R6 and R7. In a preferred embodiment of the present invention, the voltage-to-frequency converter U2 is type AD650 which is available in commercial quantities from the Analog Devices Corporation. This type of voltage-to-frequency converter provides a combination of high frequency operation and low non-linearity. It has a useful dynamic range of six decades, allowing extremely high resolution measurements. The input signal range and full scale output frequency are user-programmable with two external capacitors and one resistor.

The output from the voltage-to-frequency converter U2 is connected to the clock input of a counter U3. The counter U3, in a preferred embodiment of the present invention, is type CD4059A which is available in commercial quantities from the RCA Corporation. This type of device is a CMOS programmable divide-by-"N" counter that can be programmed to divide an input frequency by any number from 3 to 15,999. For the specific application with the preferred embodiment of the present invention, the output signal from the counter U3 remains at a logically high level until a reset occurs. This single output has TTL drive capability. The three inputs $K_a$, $K_b$ and $K_c$ determine the modulus of the first and last counting sections in accordance with a predetermined table. The stored value within the down counter U1 is decremented in response to signals from the voltage-to-frequency converter U2 until the stored value is reset by the timer U5 or until a pulse is output by the down counter U3 when the stored value is decremented to a first predetermined magnitude, which is equal to zero in a preferred embodiment of the present invention. It should be understood that, in alternative embodiments of the present invention, the first predetermined magnitude can be a value other than zero. However, in a preferred embodiment of the present invention, the value of the first predetermined magnitude is set to zero. This output pulse, which occurs when the stored value within the down counter U3 is decremented to the first predetermined magnitude, is sent through inverter U4 to a latch U6. The inverter U4, in a preferred embodiment of the present invention, is type MC14069UB which is available in commercial quantities from the Motorola Corporation. It is a hex inverter that is constructed with MOS P-channel and N-channel enhancement mode devices in a single monolithic structure. The timer U5, in a preferred embodiment of the present invention, is type LM555 which is available in commercial quantities from the National Semiconductor Corporation. This type of timer is a device used for generating accurate time delays or oscillation. When operating in the astable mode, the charge time required for capacitor C5 to charge up to 67 percent of $V_{cc}$ is defined by equation 6.

$$\text{CHARGE TIME (67\% of } V_{cc}) = 0.693(R9 + R10)C5 \quad (6)$$

Also, while operating in the astable mode, the discharge time required to discharge to 33 percent of $V_{cc}$ is defined by the relationship shown in equation 7.

$$\text{DISCHARGE TIME (33\% of } V_{cc}) = 0.693\ (R10)C5 \quad (7)$$

Therefore, the period of the timer is defined by the relationship shown in equation 8 below.

$$T = 0.693\ (R9 + 2R10)C5 \quad (8)$$

In equation 8, the period T is defined as a function of resistors R9 and R10 and capacitor C5. It should also be understood that the duty cycle D of the output is determined by the relationship shown in equation 9.

$$D = R10/(R9 + 2R10) \quad (9)$$

Capacitor C4 is attached to the control voltage for the purpose of suppressing any transients that may occur. The latch U6, in a preferred embodiment of the present invention, is type MC14042B which is available in commercial quantities from the Motorola Corporation. This type of latch is a quad transparent latch that is constructed with MOS P-channel and N-channel enhancement mode devices in a single monolithic structure. The clock polarity used to strobe data through the latch can be reversed using a polarity input. The output of the latch U6 is used as the output of the present invention, as shown, and is equivalent to the trip signal shown on line 30 in FIG. 1.

A reset switch 70 is schematically shown in FIG. 2. This reset switch 70 permits the output signal from the latch U6 to be cleared. It is analogous to the manual reset 32 shown in FIG. 1 and can be either a manual reset or an automatic reset provided by a signal from an external circuit that operates to clear the status of the output signal from the present invention. An OR-gate U7 is also provided by the present invention. The purpose for providing the OR-gate U7 is to provide both the reset switch 70 and the $Q_o$ pin of the latch U6, on line 72, with the ability to control the clock of the latch. It is important to have both of these components connected to the clock since the clock controls whether the $Q_o$ pin of the latch U6, on line 72, will consist of data $D_o$ or have a latched output. In a preferred embodiment of the present invention, the OR-gate is type MC14071B which is available in commercial quantities from the Motorola Corporation. It is constructed with P-channel and N-channel enhancement mode devices in a single monolithic structure.

In operation, the multiplier U1 of the present invention receives a first voltage as two of its inputs. This first voltage is representative of a current signal being monitored. The multiplier U1 squares this first signal and provides a second signal on line 52 to a voltage-to-frequency converter U2. It should be understood that the output from the multiplier U1 is a signal that is equal to the square of the input to the multiplier minus a DC level. The voltage-to-frequency converter U2 provides a third signal, as its output, on line 54 to a down counter U3. The frequency of the third signal is representative of the magnitude of the second signal. The second signal is the squared value of the first signal that is input to the multiplier U1. The pulses that are output by the voltage-to-frequency converter U2 are used to decrement a stored value within the down counter U3. If the value within the down counter U3 is decremented to a first predetermined magnitude, such as zero, a signal is output on line 56 through an inverter U4 to a latch U6 on line 58. Because of the fact that, in a preferred embodiment of the present invention, a fault is indicated by a zero logic level on the output of the latch, an inverter is used to provide a logically high level (i.e. a logic 1) to external circuitry. However, it should be understood that this particular use of the inverter applies to one specific embodiment of the present invention and, in alternative embodiments, may not be required. The value stored in the down counter U3 is periodically refreshed by a timer U5. Each time a logic zero is sent from the timer U5 to the down counter U3, the stored value in the down counter U3 is reset to a second predetermined magnitude. In FIG. 2, line 60 is used to provide the refresh signal to the down counter U3 from the timer U5. Also, it should be understood that line 62 is used to ground preselected pins of the down counter U3 which define a binary value that serves as the second predetermined magnitude. As discussed in detail above, this second predetermined magnitude represents a binary count to which the down counter U3 is refreshed upon the occurrence of a signal, on line 60, from the timer U5 to the down counter U3. This refreshing operation essentially raises the magnitude of the stored value in the down counter U3 to an initial magnitude from which it is continually decremented in response to subsequent signals on line 54 from the voltage-to-frequency converter U2.

The output signal from the latch U6 can be reset by a switch 70 that can either be manual or automatic. An output signal on line 68 from the latch U6 is intended for use by external circuitry which can either disconnect a load from the monitored current or cause the monitored current to be reduced by some external means.

Although alternative embodiments of the present invention are possible, the specific embodiment illustrated in FIG. 2 utilizes components whose value and type are shown in Table I.

TABLE I

| REFERENCE | TYPE OR VALUE |
| --- | --- |
| R2 | 0-20K ohm |
| R3 | 21.5K ohm |
| R4 | 15K ohm |
| R5 | 0-5K ohm |
| R6 | 10K ohm |
| R7 | 258K ohm |
| R8 | 0-5K ohm |
| R9 | 144K ohm |
| R10 | 100 ohm |
| R11 | 10K ohm |
| R12 | .15 ohm |
| R13 | 10K ohm |
| R14 | 1 Megohm |
| R15 | 10K ohm |
| C1 | .01 microfarads |
| C2 | .0015 microfarads |
| C3 | .1 microfarads |
| C4 | .01 microfarads |
| C5 | 66 microfarads |
| U1 | MPY634 (Burr-Brown) |
| U2 | AD650 (Analog Devices) |
| U3 | CD4059A (RCA) |
| U4 | MC14069UB (Motorola) |
| U5 | LM555/LM555C (National Semiconductor) |
| U6 | MC14042B (Motorola) |
| U7 | MC14071B (Motorola) |
| U8 | LM1558/LM1458 (National Semiconductor) |

Figure 3:
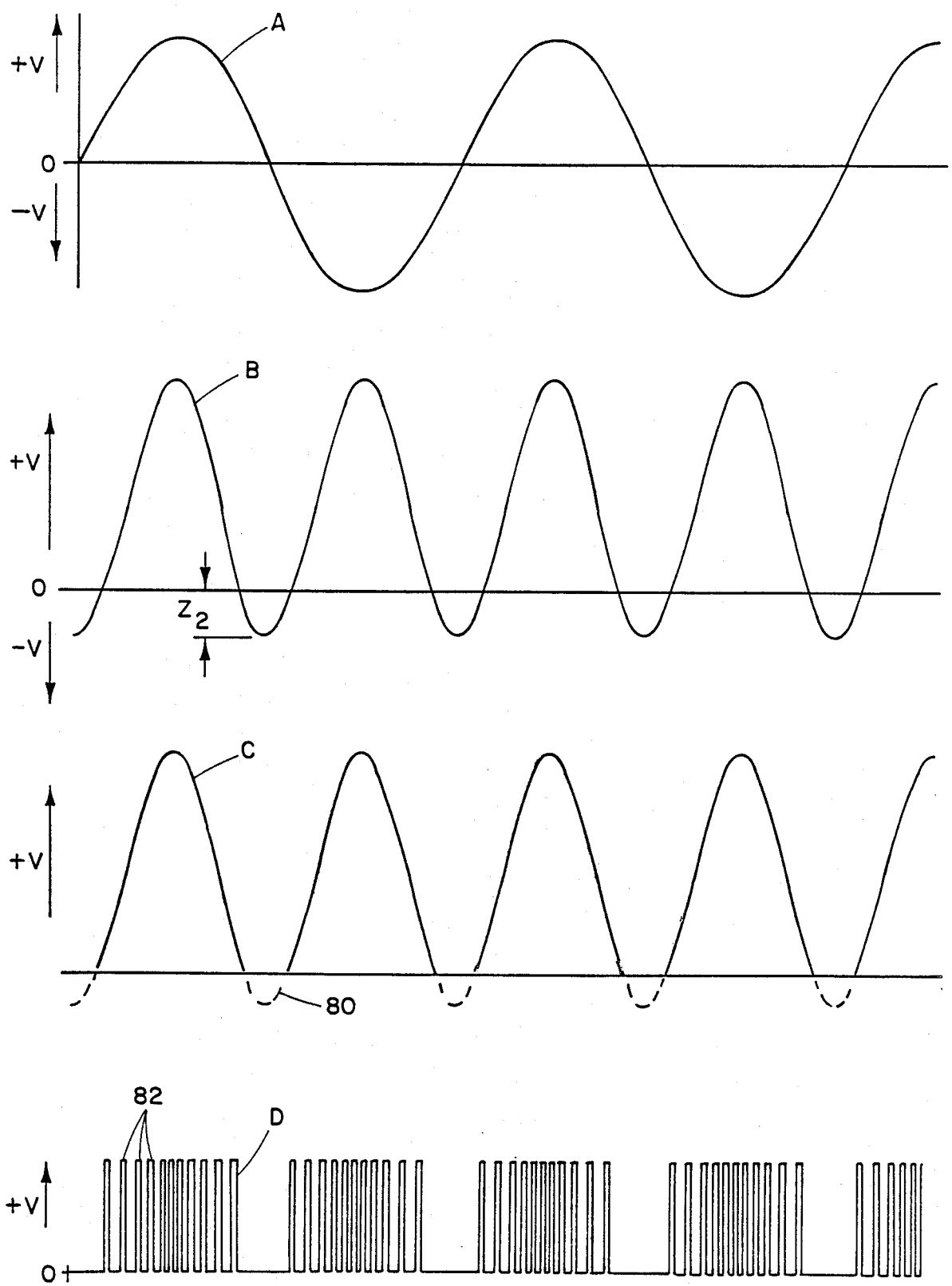
FIG. 3 is a graphical representation of the wave forms occurring at various points within a circuit incorporating the present invention.

Referring to FIG. 3, four waveforms are shown on a time-based graph to illustrate the relationship between the signals that are output by the components of the present invention illustrated in FIGS. 1 and 2. In FIG. 3, waveform A represents the first signal that is provided on line 50 to the multiplier U1 in FIG. 2 or on line 10 to the multiplier 12 shown in the simplified schematic of FIG. 1. As can be seen in FIG. 3, waveform A is an AC voltage signal that is representative of a monitored current signal. It should be understood that, although waveform A is illustrated as an AC voltage signal, the present invention is equally applicable for monitoring DC current. If a DC current is being monitored, the first signal which is input to the multiplier U1 in FIG. 2 would be a DC voltage that is representative of the magnitude of the monitored DC current. However, for purposes of describing the present invention, the illustrative waveforms in FIG. 3 have been chosen to show an example in which an AC current is being monitored.

Waveform B represents the squared value of the second signal that is output by the multiplier U1. As shown in FIG. 3, waveform B has a negative portion which results from the relationship shown in equation 2 and discussed above. This negative portion of waveform B represents the magnitude of $Z_2$ which is subtracted, by the multiplier as described above, from the value of the squared magnitude of waveform A. When the magnitude of waveform A approaches zero, its squared value also decreases to a magnitude that approaches zero and, therefore, the magnitude of waveform B can be reduced to a value less than zero when $Z_2$ is subtracted from it. As described above, waveform B is the signal that is provided as an input to the voltage-to-frequency converter U2. If the voltage-to-frequency converter U2 is of the type which does not react to negative voltage inputs, the squared value of the first voltage signal (i.e. waveform A) appears as the waveform shown as waveform C in FIG. 3. Because of this characteristic of the voltage-to-frequency converter U2, the portion 80 of waveform C shown by dashed line in FIG. 3 does not produce any effect in the output of the voltage-to-frequency converter U2. The dashed portion 80 of waveform C is shown in FIG. 3 merely for illustrative purposes and does not effect the operation of the voltage-to-frequeny converter U2. During the portions of time when the magnitude of waveform B is negative, the voltage-to-frequency converter U2 experiences a zero voltage input, as shown by waveform C. Therefore, the effective portion of waveform B, relative to the voltage-to-frequency converter U2, is shown as the solid line of waveform C in FIG. 3. This AC voltage signal, which represents the squared magnitude of the first voltage signal minus the DC level, produces a varying frequency output signal from the voltage-to-frequency converter U2 on line 54 of FIG. 2. The output of the voltage-to-frequency converter U2 is a series of pulses 82 whose frequency is representative of the magnitude of the input signal to the voltage-to-frequency converter U2 (i.e. waveform C). Waveform D, in FIG. 3, represents this varying frequency signal. As can be seen in FIG. 3, waveform D comprises a plurality of pulses which occur at a varying frequency that is representative of the magnitude of waveform C. In other words, when the magnitude of waveform C reaches a maximum value, the frequency of the pulses 82 of waveform D occur at their maximum frequency. Conversely, when the magnitude of waveform C decreases, the frequency of pulses 82 decrease until their frequency reaches zero when the magnitude of waveform C reaches zero as illustrated by the portion of the curve where the dashed portion 80 is shown. It should be understood that waveform D is exemplary and that the frequency can be significantly higher than that illustrated in FIG. 3. Each pulse 82 of the waveform D in FIG. 3 is received by the down counter U3 on line 54 in FIG. 2. Therefore, the stored value in the down counter U3 is decremented at a rate determined by the frequency of waveform D which is, in turn, representative of the magnitude of waveform C. It should therefore be apparent that the stored value in the down counter U3 is decremented at a rate which is directly responsive to the squared value of the voltage signal that is connected as an input to the multiplier U1 and which is representative of the monitored current.

FIG. 4 illustrates the relationship that is defined by equation 2 above. If the value of $Z_2$ is zero, curve 90 will be asymptotic to zero. If, however, the value of $Z_2$ is set at a value other than zero, curve 90 will be asymptotic to some other value. In FIG. 4, curve 92 represents a relationship between current and time in which the curve 92 is asymptotic to 115 percent of a rated current value. Using FIG. 4 as a hypothetical example, curve 92 would indicate that a current equivalent to 300 percent of rated current would result in the present invention providing a trip signal after 0.2 seconds elapsed time. Alternatively, a current that is equivalent to 200 percent of rated current would cause a trip signal to occur after 0.8 seconds of elapsed time. It should be understood that these examples are hypothetical and result from one particular setting of the variables available with the present invention. The values of the components of the present invention provide a response curve, such as curve 92 in FIG. 4, which is one of a family of curves. By appropriately selecting the parameters for the multiplier U1, the voltage-to-frequency converter U2, the down counter U3 and the timer U5, the present invention can be configured to operate according to the characteristics of any one of the family of curves described above.

Because, in the preferred embodiment of the present invention, the multiplier is limited to an input of approximately 11 volts even though it has a 12 volt supply, appropriate scaling techniques must be used. The scaling is primarily determined by the magnitude of the overcurrent that the monitoring circuit is designed for. For example, if the monitoring circuit is designed to be able to react to 400 percent of the rated current, a peak input voltage of 2.61 volts would be appropriate. At 400 percent of the rated current, the input voltage would be 10.4 volts, which is within the range of the multiplier. To adjust the asymptote which the lower limit of the current approaches, as shown in FIG. 4, the output of the multiplier must be defined. For example, if the value X in equation 2 is substituted according to the relationship shown in equation 10, equation 2 would be changed to the relationship shown in equation 11.

$$X = V_p(\sin wt) \tag{10}$$

$$V_{out} = V_p^2(\sin^2 wt/10) + Z_2 \tag{11}$$

In equations 10 and 11, $V_p$ is used to designate the peak value. The output waveform is equal to twice the frequency of the input and is positive if $Z_2$ is equal to zero. By providing a multiplying factor equivalent to 0.61 in equation 11, the output voltage $V_{out}$ can be expressed in terms of an effective voltage (i.e. RMS of $\sin^2 wt$). This substitution relates in the relationship shown in equation 12.

$$V_{out} = V_p^2(0.61)/10 + Z_2 \tag{12}$$

Therefore, if the magnitude of the asymptote is desired to be a specific voltage, $V_{out}$ must be equal to zero at that desired voltage level. In this particular embodiment, 115 percent was chosen as the asymptote. Therefore, at 115 percent of the rated current, the peak input voltage $V_p$ would be equal to 1.15 times 2.61 or 3.00 volts. In view of the relationship defined in equation 12, $Z_2$ would be defined as shown in equation 13.

$$Z_2 = -0.55 \text{ volts} \quad (13)$$

Equation 13 results from the fact that $V_{out}$ is equal to zero, $V_p$ is equal to 3.00 and a solution of equation 12 results in a value, for $Z_2$, of $-0.55$ volts.

Figure 5:
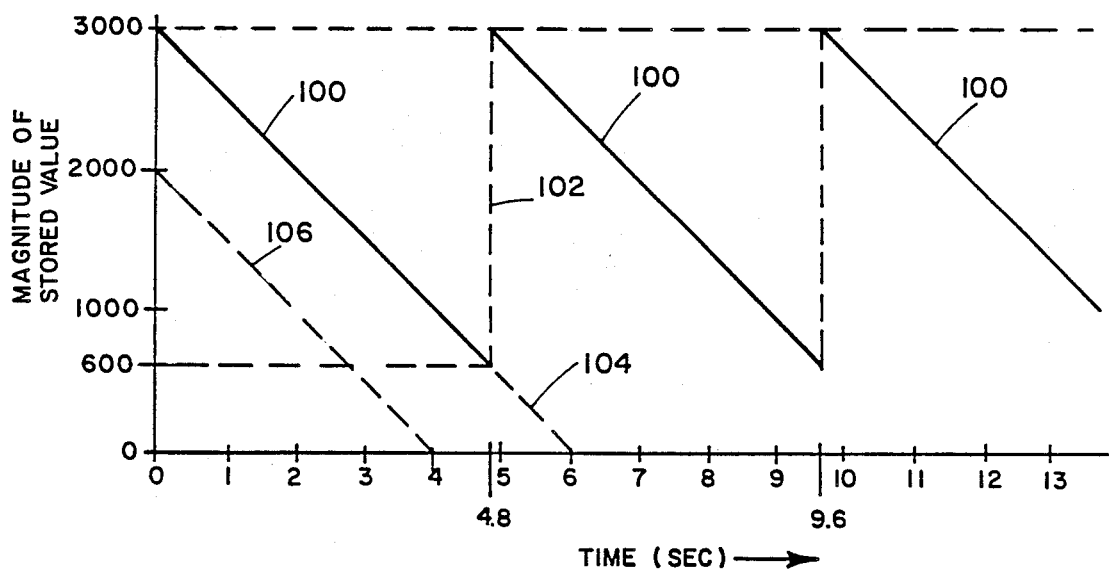
FIG. 5 illustrates a time-based profile of the counter value of the present invention incorporating one illustrative set of parameters.

FIG. 5 illustrates a time based representation of the magnitude of the stored value of the counter U3. For purposes of this hypothetical discussion, it will be assumed that the magnitude of the monitored current is such that the down counter U3 is decremented at a rate which changes the magnitude of the stored value at a rate illustrated by line 100 in FIG. 5. It must be understood that the exemplary relationships illustrated in FIGS. 5 and 6 and the related discussion below are hypothetical and are used for the purpose of describing an exemplary situation that illustrates the operation of the present invention. The values used to describe this exemplary situation are hypothetical in nature and are not intended to represent any specific embodiment of the present invention. Beginning at an initial value of 3000, line 100 indicates that the magnitude of the stored value will reach zero in approximately six seconds, as shown by the dashed line extension 104, if no other action is taken. However, as indicated by dashed line 102, the magnitude of the stored value in the down counter U3 is refreshed to 3000 at 4.8 seconds on the time scale. Immediately after the magnitude is refreshed to 3000, the subsequent pulses from the voltage-to-frequency converter U2 begin to cause the stored value to be decremented as represented by line 100 until, at 9.6 seconds on the time line, the magnitude of the stored value is again refreshed to 3000. The purpose of FIG. 5 is to illustrate that the magnitude of the stored value in the down counter U3 will not reach zero, or some other predetermined first magnitude, if the monitored current is less than a preselected threshold value because of the repeated refreshing operations performed by the timer U5. If it were not for the refreshing operation performed by the timer U5, the stored value in the down counter U3 would eventually reach zero, as indicated by dashed line 104. Also shown in FIG. 5, dashed line 106 indicates that if a lower initial magnitude of the stored value had been used (e.g. 2000), it would have been decremented to zero prior to the refreshing operation which occurs at 4.8 seconds.

Figure 6:
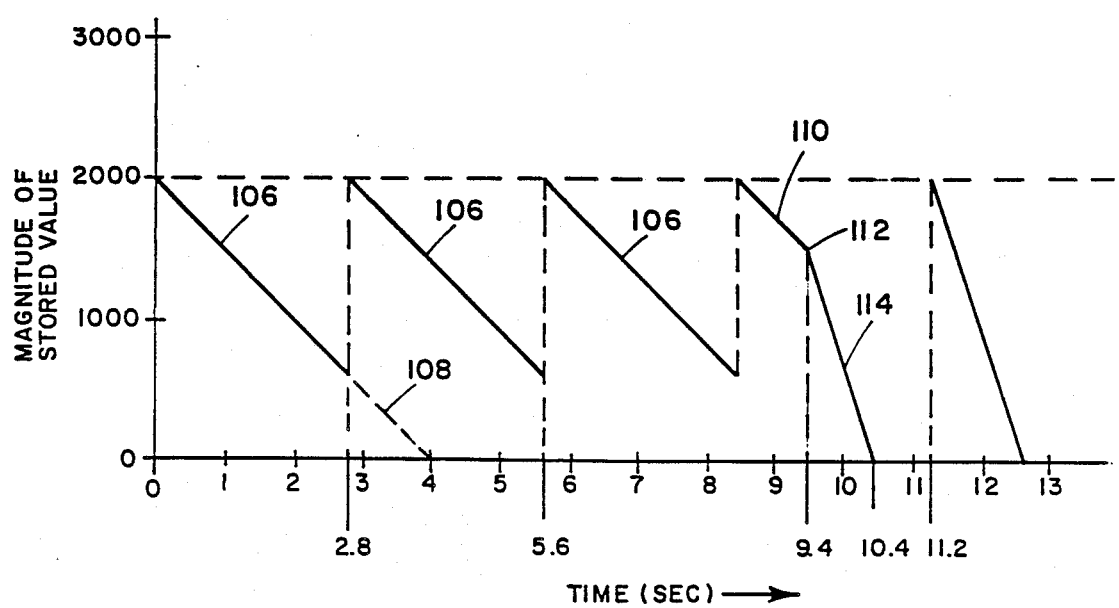
FIG. 6 illustrates a time-based profile of the counter value of the present invention under and alternative set of parameters.

Referring to FIG. 6, another hypothetical example of the operation of the present invention will be described in relation to line 106 which is also shown in FIG. 5 as a dashed line. If an initial magnitude of 2000 had been used to refresh the stored value in the down counter U3, its magnitude would decrease, because of the effect of the voltage-to-frequency converter U2, as represented by line 106. If the magnitude of the stored value is not refreshed, it would eventually reach zero at a time of four seconds as indicated by dashed line 108. In FIG. 6, from zero seconds to 9.4 seconds the sequence of operation is normal with the magnitude of the stored value being refreshed at times of 2.8 seconds, 5.6 seconds and 8.4 seconds. For purposes of illustrating the operation of the present invention when the monitored current exceeds a preselected threshold, the exemplary rate of decrease of the magnitude of the stored value is shown to change at 9.4 seconds on the time line. It should be understood that line 110 is generally parallel to line 106 and represents an acceptable rate of decrease in the stored value because of the fact that the magnitude of the monitored current is acceptable. However, at 9.4 seconds on the time line the rate of decrease of the stored value increases at a point 112, as shown by line 114. The rate of decrease of the stored value, as indicated by line 114, is sufficient to cause the magnitude to reach zero at 10.4 seconds. Since the magnitude of the stored value reaches zero prior to 11.2 seconds on the time line, when the timer U5 would have again refreshed the magnitude of the stored value, a signal would be sent by the down counter to the latch and a trip signal would be output by the present invention.

Although the present invention has been described and illustrated with considerable specificity, it should be understood that alternative embodiments of the present invention are possible and should be considered to be within the scope of the present invention.

What I claim is:

1. A detection circuit, comprising:
   first means for providing a first signal representative of an electrical current;
   second means for providing a second signal representative of the squared value of said first signal, said first providing means being connected in signal communication with an input of said second providing means;
   third means for providing a third signal, said third signal comprising a series of pulses, said series of the pulses having a frequency that is representative of the magnitude of said second signal, an input of said third providing means being connected in signal communications with an output of said second providing means;
   means for decrementing a stored value, said decrementing means being operative in response to said third signal, an input of said decrementing means being connected in signal communication with an output of said third providing means;
   fourth means for providing a fourth signal when said stored value is equal to a first predetermined magnitude, an input of said fourth providing means being connected in signal communication with an output of said decrementing means; and
   means for periodically setting said stored value equal to a second predetermined magnitude, an output of said setting means being connected in signal communication with an input of said decrementing means.

2. The circuit of claim 1, further comprising:
   means for latching said fourth signal, said latching means being connected in signal communication with an output of said fourth providing means.

3. The circuit of claim 2, further comprising:
   means for resetting said latching means.

4. The circuit of claim 1, wherein:
   said third providing means comprises a voltage-to-frequency converter.

5. the circuit of claim 1, wherein:
   said decrementing means comprises a down counter.

6. A monitoring circuit, comprising:
   first means for receiving a first signal;
   first means connected in signal communication with an output of said first receiving means for providing a second signal that is representative of a squared value of said first signal;
   second means connected in signal communication with an output of said first providing means for providing a third signal, said third signal comprising a series of pulses occurring at a frequency which is representative of a magnitude of said second signal;

means for storing a first value;

means connected in signal communication with said storing means and an output of said second providing means for changing the magnitude of said first value in response to the magnitude of said frequency of said third signal;

means connected in signal communication with said changing means for resetting said first value to a first predetermined magnitude; and third means connected in signal communication with said changing means for providing a fourth signal when said first value is equal to a second predetermined magnitude.

7. The circuit of claim 6, wherein:

said first providing means comprises a multiplier having its inputs connected in signal communication with said first receiving means.

8. The circuit of claim 6, wherein:

said second providing means comprises a voltage-to-frequency converter connected to send said series of pulses to said changing means at a frequency representative of the magnitude of said second signal.

9. The circuit of claim 6, wherein:

said changing means decreases the magnitude of said first value in response to each pulse of said series of pulses received from said second providing means.

10. The circuit of claim 6, wherein:

said resetting means sets said first value equal to said first predetermined magnitude at periodic intervals.

11. The circuit of claim 6, wherein:

said second predetermined magnitude is equal to zero.

12. The circuit of claim 6, wherein:

said changing means is a down counter.

13. The circuit of claim 6, further comprising:

means connected in signal communication with said third providing means for latching said fourth signal.

14. The circuit of claim 13, further comprising:

means for resetting said latching means.

15. A monitoring circuit, comprising:

a multiplier connected to receive a first signal and to multiply said first signal by itself;

a voltage-to-frequency converter connected in signal communication with an output of said multiplier to provide a second output signal having a frequency representative of the magnitude of the product of said first signal multiplied by itself;

a counter connected in signal communication with an output of said voltage-to-frequency converter to change the magnitude of a stored value in response to pulses of said second output signal of said voltage-to-frequency converter, said counter providing a third output signal in response to said stored value being equal to a second predetermined magnitude; and a timer connected in signal communication with an input of said counter adapted to periodically reset said stored value to a predetermined magnitude.

16. The circuit of claim 15, further comprising:

a latch connected in signal communication with said counter, said latch having an input connected to receive said third output signal of said counter.

17. A method for monitoring a current, comprising:

providing a first signal representative of an electrical current;

providing a second signal representative of the squared value of said first signal;

providing a third signal, said third signal comprising a series of pulses, said series of the pulses having a frequency that is representative of the magnitude of said second signal;

decrementing a stored value, said decrementing step being operative in response to said third signal;

providing a fourth signal when said stored value is equal to a first predetermined magnitude;

periodically setting said stored value equal to a second predetermined magnitude; and latching said fourth signal.

* * * * *